United States Patent [19]
Soref

[11] Patent Number: 5,004,447
[45] Date of Patent: Apr. 2, 1991

[54] LOW LOSS SEMICONDUCTOR DIRECTIONAL COUPLER SWITCHES INCLUDING GAIN METHOD OF SWITCHING LIGHT USING SAME

[75] Inventor: Richard A. Soref, Newton Centre, Mass.

[73] Assignee: The United States of America as represented by the Secretary of the Air Force, Washington, D.C.

[21] Appl. No.: 403,636

[22] Filed: Sep. 6, 1989

[51] Int. Cl.⁵ .................. G02B 6/10; G02B 6/26; H01L 27/12

[52] U.S. Cl. .................. 350/96.14; 350/96.13; 350/96.15; 350/320; 357/4; 357/16; 357/30

[58] Field of Search .......... 350/96.10, 96.11, 96.12, 350/96.13, 96.14, 96.15, 354, 355, 356, 320; 372/6, 43, 44, 45, 46, 47, 48, 50; 357/16, 17, 19, 25, 30, 45, 48, 4, 45 L

[56] References Cited

U.S. PATENT DOCUMENTS

| | | | |
|---|---|---|---|
| 4,717,228 | 1/1988 | Thylén | 350/96.14 |
| 4,728,167 | 3/1988 | Soref et al. | 350/96.13 |
| 4,737,003 | 4/1988 | Matsumura et al. | 350/96.14 |
| 4,784,451 | 11/1988 | Nakamura et al. | 350/96.14 |
| 4,798,435 | 1/1989 | Fujiwara et al. | 350/96.13 |
| 4,832,430 | 5/1989 | Tada et al. | 350/96.14 |
| 4,865,408 | 9/1989 | Korotky | 350/96.13 |
| 4,923,264 | 5/1990 | Langer et al. | 350/96.14 |

*Primary Examiner*—Brian Healy
*Attorney, Agent, or Firm*—Robert L. Nathans; Donald J. Singer

[57] ABSTRACT

In multiple quantum well directional couplers, non-centralized input and output legs, occupying major portions of the switches, are continuously forward biased, to produce sufficient gain in light intensity therein to overcome losses in the centralized portions, to in turn provide a transparent (ODB loss) two-by-two coupler switch. Short segments of the centralized coupling portion occupying minor portions of the switches, are switched between forward bias states and zero bias states to provide light beam switching. Thus these switches employ both carrier gain and carrier refraction. The large changes in the index of refraction enable extremely short, low loss, switches to be fabricated and cascaded if desired. A second group of less preferred switches employ solely the carrier refraction effect, by injecting carriers into the waveguides at high levels, preferably equal to or greater than $1 \times 10^{18}/cm^3$.

19 Claims, 6 Drawing Sheets

LOW LOSS SEMICONDUCTOR DIRECTIONAL COUPLER SWITCHES INCLUDING GAIN METHOD OF SWITCHING LIGHT USING SAME

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of opto-electronic directional couplers.

Prior art directional couplers are interferometric two-by-two light beam switches where both channels are preserved for both the bar and cross states. The waveguide channels are optically coupled at centralized portions thereof.

The nature of delta-beta and delta K directional couplers are also well known. See example U.S. Pat. No. 4,756,588, issued to Granestrand and the references and publications cited therein.

In U.S. Pat. No. 4,778,235, the inventor, Fujiwara discloses switches which utilize the lateral spreading or fanning out of light, to produce the desired light losses at selected legs of the switch. See FIG. 6 in particular, and col. 7. His switches are "gain guided" so that at zero bias, portions of his waveguide "disappears". In sharp contrast, the switches of the present invention employ index-guided-channel waveguides, having strip-loaded ribs, buried inverted ribs, or other embedded corrugations, producing a lateral index step for horizontal confinement of light as well as the vertical confinement. In the present invention, band-to-band optical absorption in the waveguide at zero or reverse bias, produces the desired optical attenuation, in contrast with the lateral fanning-out of light which occurs in waveguide portions of all of Fujiwara's devices. As a result, our on-off light contrast ratio will be 1000/1 or more in contrast with Fujiwara result, estimated at 100/1 or less which will thus produce more crosstalk than switches of the present invention. Regarding his "directional coupler" of FIGS. 3 and 4, one of the waveguides will disappear so that, in contrast with the present invention, he doesn't teach a true 2×2 directional coupler switch where both data channels are preserved at both outputs, for both the bar and cross states, and thus light-modulated data would be lost.

Although he suggests utilizing refractive index changes and gain differences in what he calls a directional coupler, he cannot preserve both data channels, as one waveguide disappears. That is, he never has two index-guided channels for a true 2×2 interferometric directional coupler.

U.S. Pat. No. 4,737,003 to Matsumura teaches quantum well switching devices with carrier injection at cross-over guide portions. These however are of the deflection or refraction type.

Directional coupler switches of the delta-beta type are also described in U.S. Pat. No. 4,784,451 to Nakamura et al; see col 6, lines 38, through the remaining detailed description. However, in contrast with the present invention, these devices are reversed biased and employ the pockels effect to change the index of refraction. The result is that strong electric fields and relatively few carriers are induced into the semiconductor material which limits the change in the index of refraction. U.S. Pat. No. 4,720,174 to Baker discloses a biased liquid crystal for switching a directional coupler. Our switching speeds are much faster and employ all solid state waveguides.

SUMMARY OF PREFERRED EMBODIMENTS OF THE INVENTION

In preferred directional couplers of the present invention, the non-centralized fan out input and output legs, occupying major portions of the switches, are continuously forward biased, as long as the couplers are performing switching, to produce sufficient gain in light intensity therein to overcome losses in the centralized portions, to in turn provide a transparent (ODB loss) two-by-two coupler switch. Short segments of the centralized coupling portion occupying minor portions of the switches, are switched between forward bias states and zero bias states to provide light beam switching. Thus these switches employ both carrier gain and carrier refraction. The large changes in the index of refraction enable extremely short, low loss, switches to be fabricated and cascaded if desired. A second group of less preferred switches employ solely the carrier refraction effect, by injecting carriers into the waveguides at high levels, preferably equal to or greater than $1 \times 10^{18}/cm^3$.

BRIEF DESCRIPTIONS OF THE DRAWINGS

Other objects, features, and advantages of the present invention will become apparent upon study of the following description taken in conjunction with the drawings in which.

DETAILED DESCRIPTION OF PREFERRED EMBODIMENTS OF THE INVENTION

Figure 1A:
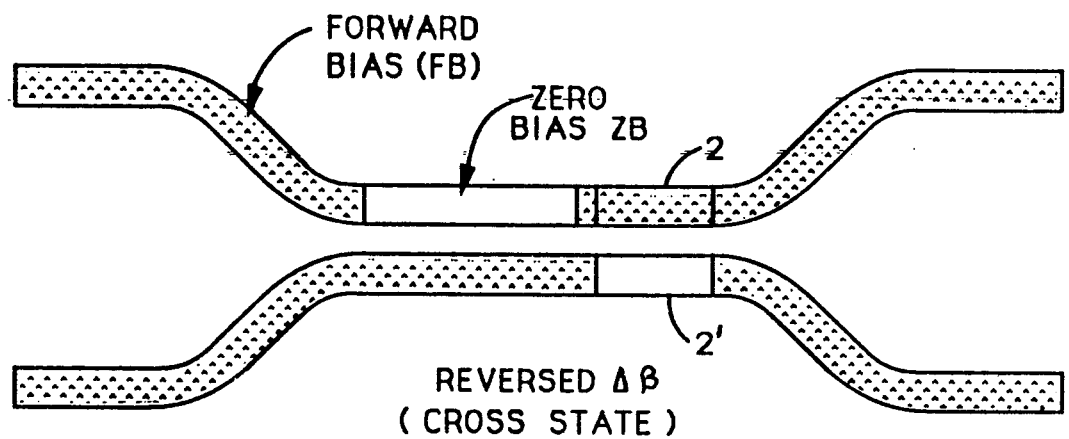
FIGS. 1a, 1b, 7a and 7b illustrate delta-beta directional coupler switches embodying the invention.
Figure 1B:
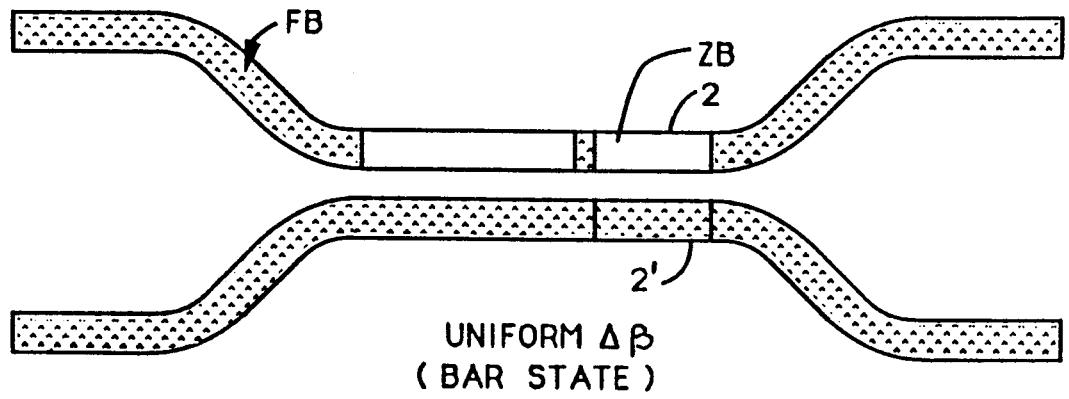
Figure 2:
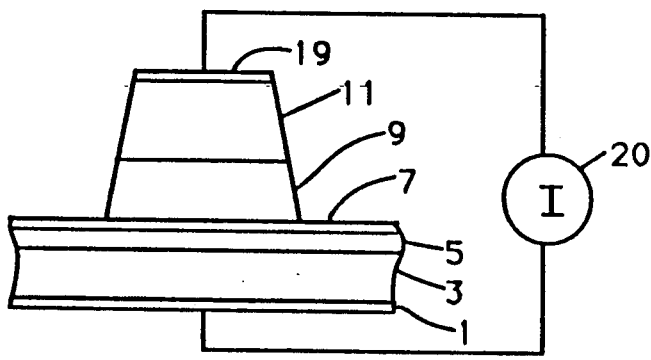
FIG. 2 illustrates an exemplary waveguide portion in cross section.

FIGS. 1a, 1b, 3a and 3b illustrate phase-and-amplitude-controlled coupler switches, and FIG. 2 illustrates an exemplary waveguide portion. These switches are quantum well (QW) directional couplers in which major channel waveguide portions are electroded and are always turned on, that is, they are injected with sufficient carrier density during forward bias that the waveguides are all lossless, that is transparent. In the switch of FIGS. 1a and 1b, to attain the cross and bar states, centrally positioned localized portions 2 and 2' of the coupled waveguides are turned on and off, as shown, which changes the refractive index of the guides by employing a carrier refraction effect large enough to induce complete switching. The index change $\Delta n = n(forward) - n(zero) =$ about $+0.04$. This implies that the interaction length for this coupler is less than 100 microns, a small number indeed, and importantly, the zero-bias optical loss along a 100 $\mu m$ path is small. In all illustrated switches, the dotted areas represent the forward biased (FB) state and the clear areas represent the zero bias (ZB) state.

FIG. 2 illustrates a cross-sectional view of a waveguide portion suitable for use in the present invention, which comprises a laser-like multi-layered semiconductor capable of amplifying light passed therethrough. The etching profile, the doping, the active-region composition and the cladding-layer composition are chosen so that the waveguide is strongly index-guided, rather than gain-guided. In most applications, the waveguide will be a single-mode structure, which leads to submicron and micron cross-sections. For example, the height of the active region 7 would be typically 0.1 to 0.2 $\mu$m, with a 1 to 2 $\mu$m rib width. The active region is arranged to have a strong overlap with the guided-mode optical field (a large "filling factor"). This means that the gain region would be centered in the waveguide core, or would be contiguous with the core.

More specifically, layer 1 is an ohmic electrode, layer 3 is n+AlGaAs, layer 5 is nAlGaAs, active layer 7 for producing amplification of light preferably comprises two to ten quantum wells. Layer 9 is pAlGaAs, layer 11 is p+AlGaAs, and layer 19 is a second ohmic electrode which is connected to voltage or current source 20 for applying forward or zero bias to the waveguide.

Figure 3A:
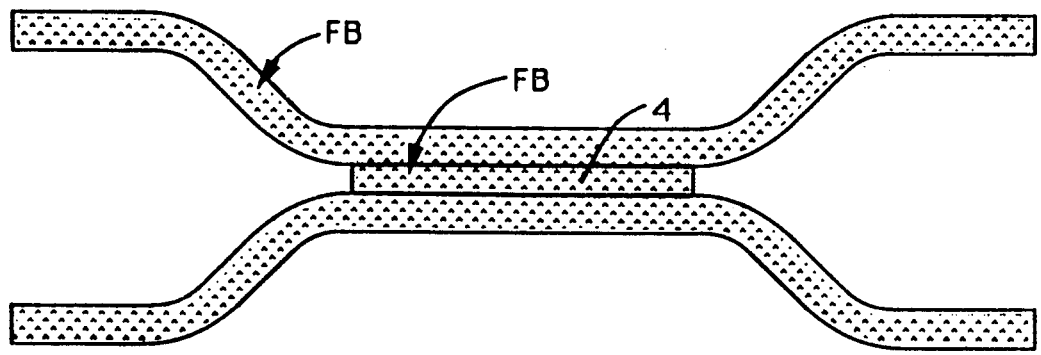
FIGS. 3a, 3b, 8a and 8b illustrate delta K switches embodying the invention.
Figure 3B:
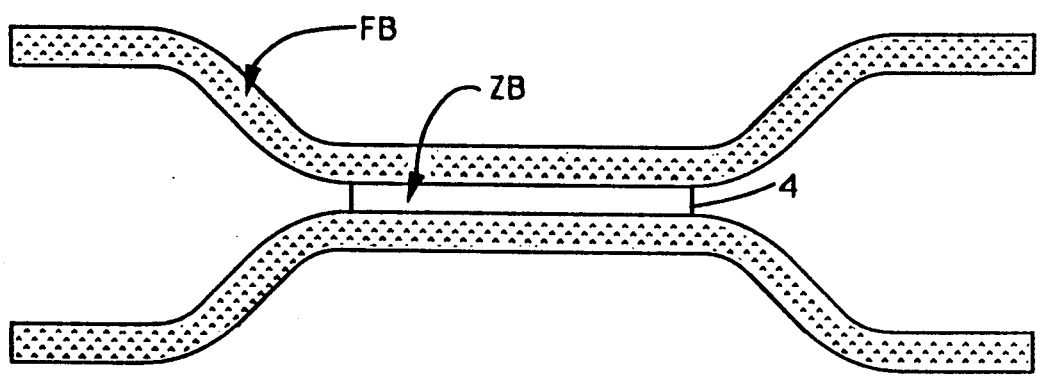
Figure 4A:
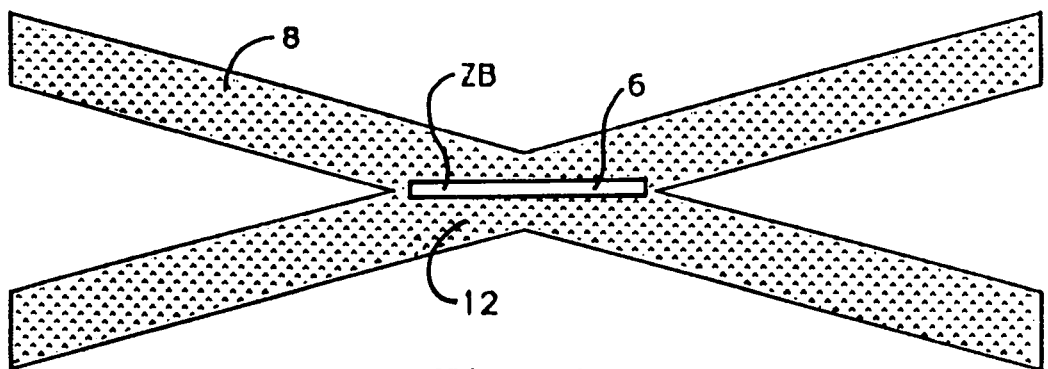
FIGS. 4a, 4b, 9a and 9b illustrate X type switches embodying the invention.
Figure 4B:
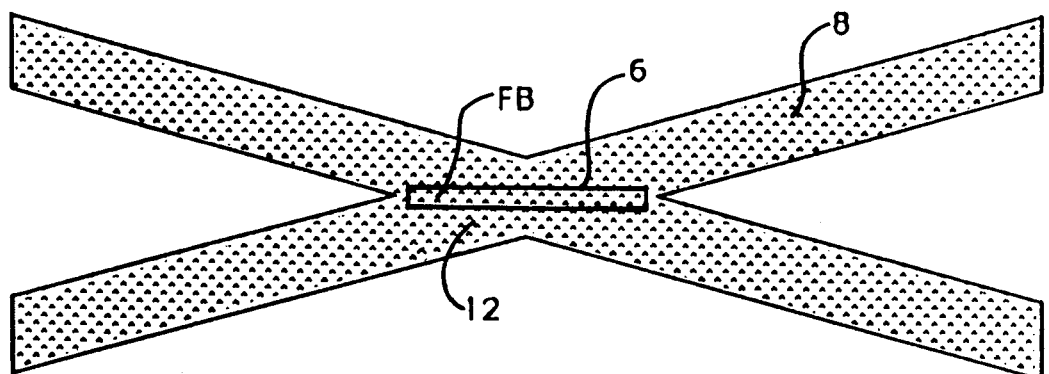

FIGS. 3a, 3b illustrate a $2 \times 2 \Delta K$ two-level directional coupler switch, in which the interguide space or coupling region 4 is also electroded and forward biased to transparency. By turning this coupling region off (zero bias), the coupling strength K changes by an amount $\pi L_c/2$, a change large enough to induce a transition from the cross state to the bar state. $L_c$ is the effective coupling length. FIGS. 4a, 4b show a transparent (lossless or ODB) $2 \times 2$ X-switch having an amplitude-and-phase structure with transparent 1-mode forward biased guides 8, and a transparent 2-mode intersection 12. The switched rectangle 6 in the intersection is electroded, and is designed to perturb selectively the symmetric mode. Since $\Delta n$ is large when that rectangle is turned off, this $\Delta n$ will induce complete $2 \times 2$ switching via 2-mode interference for an appropriate choice of rectangle length, a few hundred microns in practice. The device goes from the cross state (FIG. 4a) to the bar (FIG. 4b) state.

Figure 5:
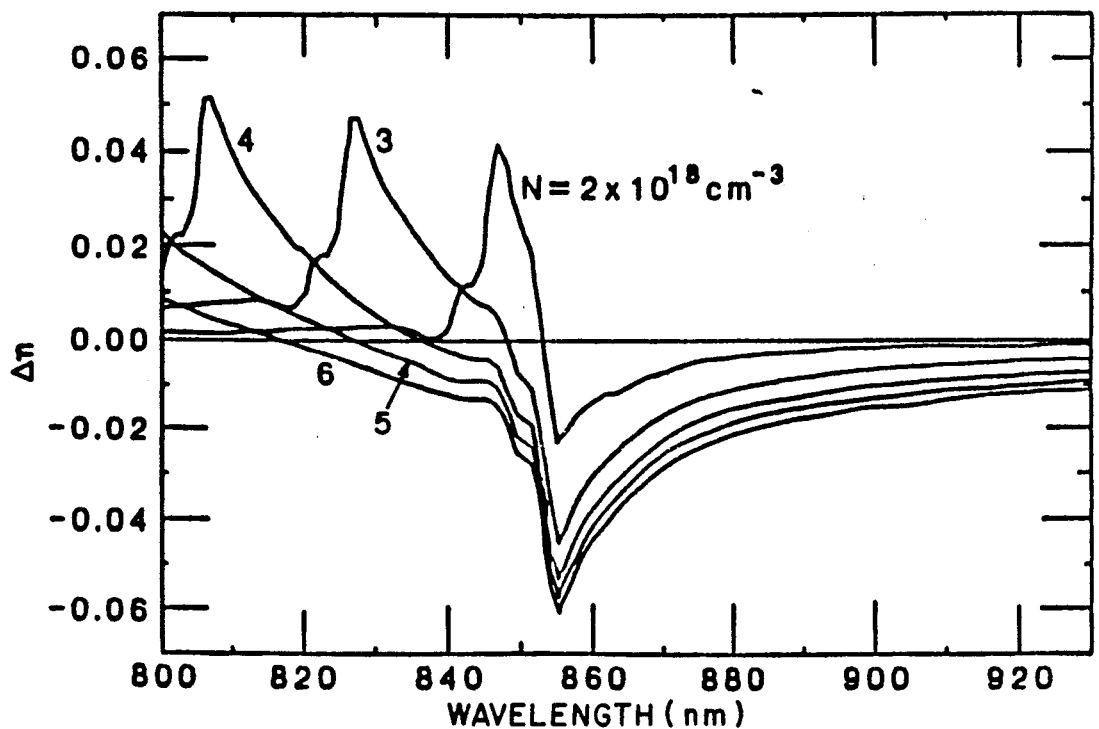
FIG. 5 illustrates changes in the index of refraction during switching for various carrier concentrations.
Figure 6:
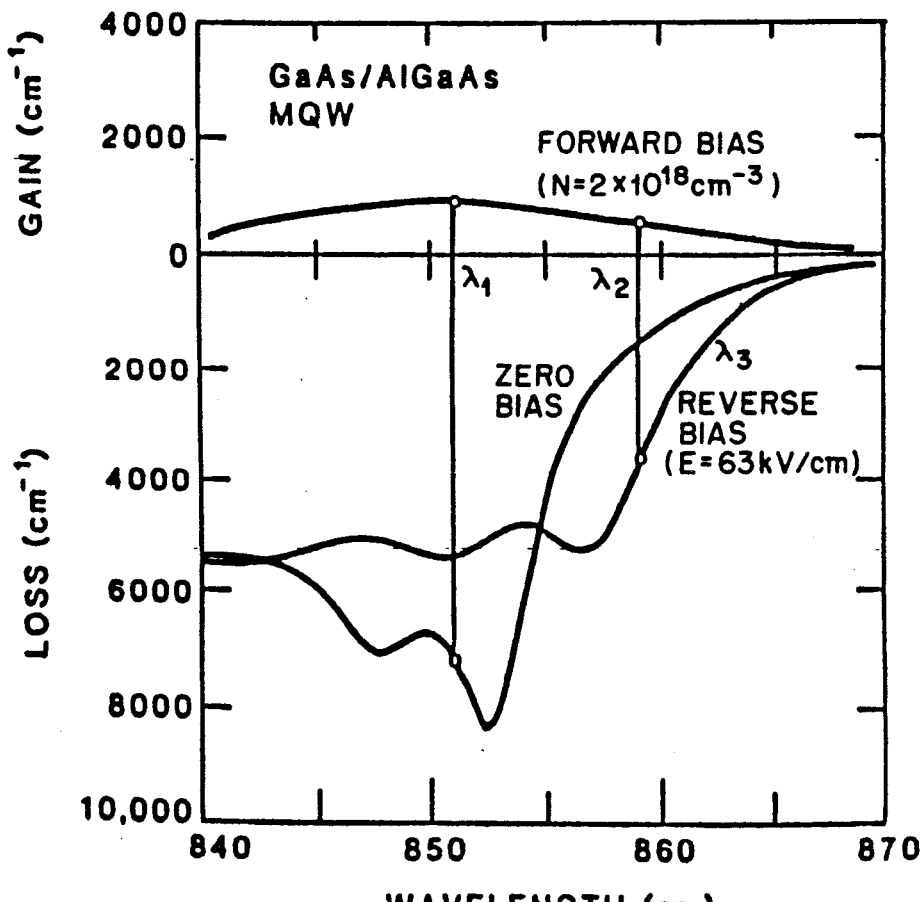
FIG. 6 illustrates gains and losses within waveguide portions as a function of wavelength and bias.
Figure 7A:
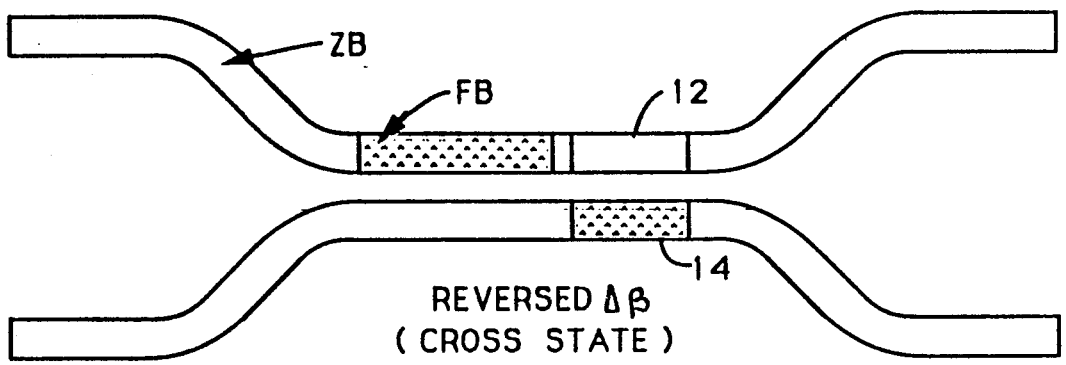
Figure 7B:
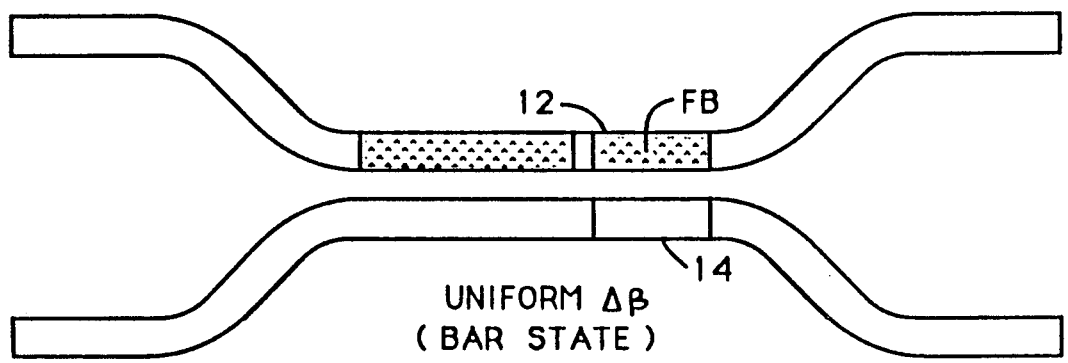

A low loss delta-beta directional coupler utilizing the carrier refraction effect is illustrated in FIGS. 7a, 7b. This switch uses low-loss QW channel waveguides at zero bias (passive guides). The switched, forward-biased, carrier injecting regions 12 and 14 in the coupler (gain regions) are shaded as shown. However, the gain per se does not alter the coupled modes. The amplitude control is negligible because the wavelength of operation is well beyond (longer than) the gain wavelengths, greater than $\pi 3$, shown in FIG. 6. Instead, we use only the large $\Delta n$, as shown in FIG. 5, that occurs when portions of the guides are turned on. This switch of FIGS. 7a and 7b and the switches of FIGS. 8 and 9 are for switching light beams having a wavelength longer than the absorption edge wavelength at zero bias and also longer than the gain wing wavelength at forward bias. This wavelength would be about 900 nanometers for a GaAs based waveguide.

Figure 8A:
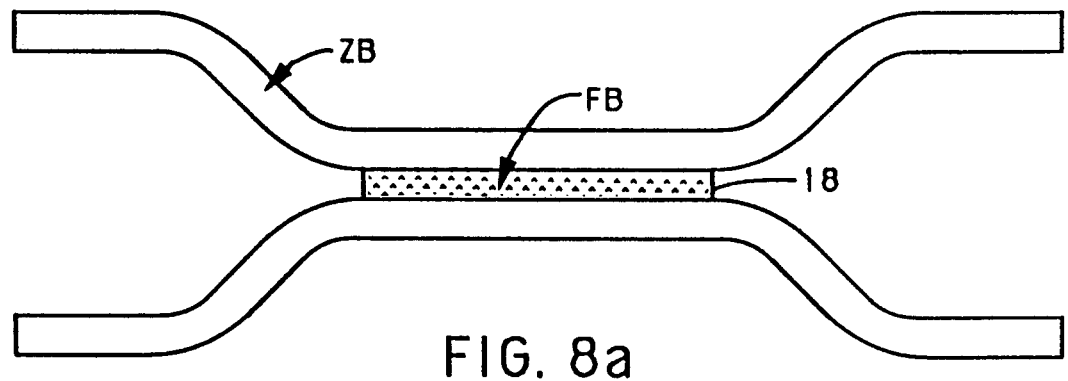
Figure 8B:
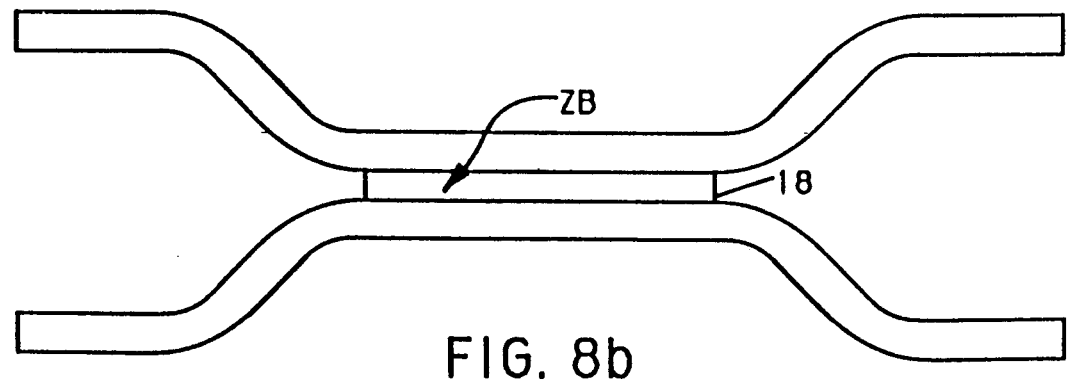

A low-loss $2 \times 2$ $\Delta K$ directional coupler switch, operating at the same wavelength, is illustrated in FIGS. 8a, 8b. This is similar in operation to the preceding device, except here the refractive index change occurs in the area between the channels as indicated. Complete switching is feasible because $\Delta n$ is $>0.01$.

Figure 9A:
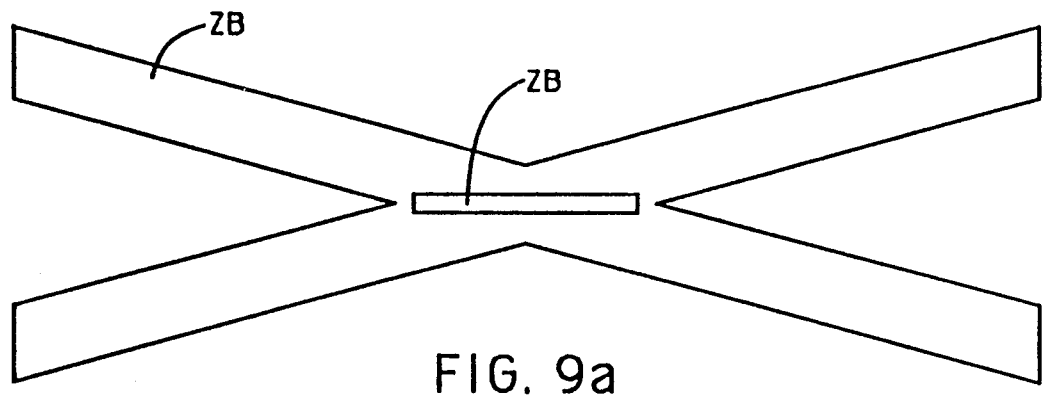
Figure 9B:
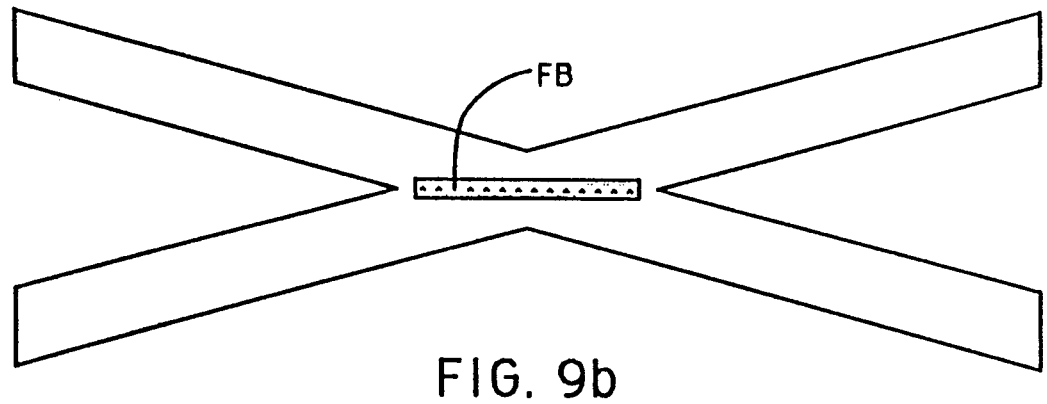

A low-loss $2 \times 2$ X-switch, operating at the same wavelength, is illustrated in FIGS. 9a, 9b. Again like FIGS. 7a, 7b, a passive QW channel waveguide device is provided, with a carrier-controlled rectangle in the 2-mode intersection. The large induced-phase retardation due to the rectangle will produce complete $2 \times 2$ switching.

Thus if the bias on a waveguide segment is changed from forward to zero bias, the refractive index of the waveguide core will change by an amount indicated in FIG. 5, which presents representative values of $\Delta n = n(f.b.) - n(z.b.)$ in an AlGaAsMQW waveguide for five values of injected carrier density N from $2 \times 10^{18}$/cm$^3$ to $6 \times 10^{18}$/cm$^3$. Good use of this index change can be made in these switching devices. In the switches of FIGS. 1, 3, and 4, most of the guided-wave structure remains forward biased into a transparent condition. Then, portions of those guides are turned off, leading to a fairly small amplitude change (which is neglected) and to a refractive index change which is used to transfer light from one guide to another. As mentioned above, the wavelength of operation $\pi 3$ is on the long-wave side of the gain curve. See FIG. 6. Thus, zero-or-forward bias at $\pi 3$, implies that the optical absorption in the zero-bias state will be approximately 100 cm$^{-1}$, constituting a propagation loss of 430 dB/cm. This loss, however, does not play a significant role in switching because the interaction lengths here are of the order of 100 $\mu$m, and the above loss is only 0.43 dB along an 100 $\mu$m segment of unbiased guide. At a carrier injection of $2 \times 10^{18}$ cm$^{-3}$, we find from FIG. 5, that $\Delta n = -0.010$ at 865 nm, plus a $\Delta n$ term of $-0.003$ from the free-carrier plasma. The delta-beta directional coupler, the delta K coupler and the X-switch are, in the absence of the present invention, standard integrated-optical devices.

Apart from the small segments 2b having zero bias, each switch is lossless due to its amplification properties in the larger FB, forward biased portions. The interaction length in FIG. 2 is approx $\sqrt{3}\pi/(\Delta \beta)$, which is $\sqrt{3}\pi/2\Delta n$). This length is only 57 $\mu$m in the above example. For the $\Delta K$ switch, the required length is $\pi(2\Delta K)$, and $\Delta K$ in turn is a function of the complex index change $\Delta n + i\Delta g$ induced by the bias change, where $\Delta g$ is the growth coefficient, the opposite of the extinction coefficient $\Delta k$. We have the option of using reverse bias in the inter-guide region rather than zero bias, since that would increase the index swing to $2\Delta n + i(\Delta g + \Delta k)$, approximately, without inducing significant loss in the switch. We anticipate an active coupling length of about 100 $\mu$m in the $\Delta K$ switch. The variable-bias segment 6 in the X switch is approximately $\pi/(2\Delta n)$ long, similar to the active length in FIG. 1.

In the second category of phase-controlled switches of FIGS. 7, 8, and 9, we neglect the gain that occurs during forward bias and use only the refractive-index shift during bias shift. This can be accomplished by using a long wavelength $\pi 4$ at which gain has vanished, for example, 900 nm. Here, $\Delta n$ persists, even though the gain has "died". These switches employ MQW waveguide couplers in which most of the waveguide area stays at zero bias, while small selected portions are forward biased to induce $\Delta n$. In such devices, optical absorption at zero bias is a potential problem. This static loss decreases as the wavelength increases, but also $\Delta n$ decreases. So, there is as compromise wavelength. As Soref and Bennett show for GaAlAs MQWs, one can get $\Delta n = -0.0091$ (including the free-carrier plasma contribution) at $\pi = 930$ nm when $N = 3 \times 10^{18}$ cm$^{-3}$ with an estimated zero-current loss of 5 cm$^{-1}$. And, there is a free-carrier absorption loss of 13 cm$^{-1}$ during injection. FIGS. 7 and 8 illustrate carrier-induced phase-controlled electrooptical switching in reversed $\Delta\beta$ and $\Delta K$ structures. The first switch of FIG. 7 is unipolar. Its interaction length is 89 μm in the above example, and it does not have appreciable spontaneous emission noise. The variable-K switch of RFIG. 8 has a nice feature. Like the aforesaid switch of FIG. 3, it makes use of both the gain and the refraction change within the space between the channels in order to modify the coupling coefficient K. The synergistic use of $\Delta g$ and $\Delta n$ means that the active length of the $\Delta K$ switch will remain fairly small; less than 500 μm. As before, the coupling zone could be reverse-biased ton induce even larger K-shaifts without attenuating the guided waves significantly. It can be shown that the free-carrier loss in the coupler gasp will not introduce serious propagation loss in the switch, although one has to contend with the unbiased 5 cm$^{-1}$ absorption of the waveguide material.

While there has been described what is at present considered to be the preferred embodiments of this invention, it will be obvious to those skilled in the art that various changes and modifications may be made therein without departing from the invention and it is, therefore, intended in the appended claims to cover all su h changes and modifications as fall within the true spirit and scope of the invention, including art recognized equivalents.

What is claimed is:

1. An interferometric directional coupler switch comprising:
   (a) a pair of first and second index-guided laser-like multi-layered semiconductor waveguides for switching light beams having a wavelength on the longer wave side of the gain spectrum of said waveguides, said light beams traveling along a longitudinal axis of said coupler switch;
   (b) a centralized first waveguide portion wherein the first and second waveguides are in close coupling relationship and at least one non-centralized waveguide portion wherein said waveguides are not in a closely coupled relationship, said centralized and non-centralized waveguide portions being tandemly positioned along said longitudinal axis;
   (c) first forward biasing means for intermittently injecting sufficient carriers through said centralized first waveguide portion for producing a carrier refraction and gain effect therein great enough to change the state of said directional coupler switch; and
   (d) second forward biasing means for continuously injecting sufficient carriers through said non-centralized waveguide portion for producing carrier induced gain of light intensity therein.

2. Directional coupler switch of claim 1 wherein said directional coupler is of the delta-beta type and said first forward biasing means includes electrode means positioned on top of said waveguides at said centralized coupling portion for changing the index of refraction thereof.

3. Directional coupler of claim 1 wherein said directional coupler is of the delta K type and said first biasing means includes electrode means positioned between said pair of waveguides in said centralized coupling portion for changing the coupling coefficient of said directional coupler switch.

4. The directional switch of claim 1 wherein said index-guided waveguides have two to ten quantum wells in a waveguide core portion thereof.

5. The directional switch of claim 2 wherein said index-guided waveguides have two to ten quantum wells in a waveguide core portion thereof.

6. The directional switch of claim 3 wherein said index-guided waveguides have two to ten quantum wells in a waveguide core portion thereof.

7. The directional switch of claims 1, 2, 3, 4, 5 or 6, wherein said first and second forward biasing means inject carriers into said waveguides having a density of $1 \times 10^{18}/cm^3$ or more, and wherein said centralized waveguide portion has an interaction coupling length of about 500 micrometers or less.

8. The directional coupler switch of claims 1, 2, 3, 4, 5 or 6 wherein said first forward biasing means includes first electrode means positioned on minor portions of said coupler switch and said second forward biasing means includes second electrode means positioned on major portions of said coupler switch for continuously injecting said carriers therein.

9. The directional coupler switch of claim 7 wherein said first forward biasing means includes first electrode means positioned on minor portions of said coupler switch and said second forward biasing means includes second electrode means positioned on major portions of said coupler switch for continuously injecting said carriers therein.

10. The directional coupler switch of claim 7 wherein said forward biasing means comprises electrode means for selectively applying a voltage of one polarity or zero volts to said directional coupler switch.

11. The directional coupler switch of claim 8 wherein said forward biasing means comprises electrode means for selectively applying a voltage of one polarity or zero volts to said directional coupler switch.

12. The directional coupler switch of claim 9 wherein said forward biasing means comprises electrode means for selectively applying a voltage of one polarity or zero volts to said directional coupler switch.

13. Method of switching light beams comprising the steps of:
   (a) providing an interferometric two-by-two directional coupler switch having a pair of index guided laser-like multi-layered semiconductor waveguides in close coupling relationship in a centralized waveguide coupling portion for supporting two modes and converging and diverging non-centralized waveguide portions for supporting one mode, said directional coupler switch being capable of assuming a two-fold bar or cross state and further including forward biasing means for intermittently injecting sufficient carriers through said centralized semiconductor waveguide portions for producing a carrier refraction effect therein great enough to change the state of said directional couper switch; and
   (b) passing light beams, through said directional coupler switch having a wavelength longer than the absorption edge wavelength at zero bias and also longer than the gain wing wavelength at forward bias.

14. The method of claim 13 including the step of applying a voltage of a given polarity to said forward biasing means to change the index of refraction thereof to a sufficient degree to change the state of said switch.

15. The method of claims 13 or 14 wherein said index-guided waveguides have two to ten quantum wells in a core portion thereof.

16. The method of claim 13 or 14 wherein said first and second forward biasing means inject carriers into said waveguides having a density of $1 \times 10^{18}/cm^3$ or more, and wherein said centralized waveguide portion has an interaction coupling length of about 500 micrometers or less.

17. The method of claim 15 wherein said first and second forward biasing means inject carriers into said waveguides having a density of $1 \times 10^{18}/cm^3$ or more, and wherein said centralized waveguide portion has an interaction coupling length of about 500 micrometers or less.

18. The coupler switch of claim 1 comprising second and third waveguide portions having converging and diverging waveguides in said second and third waveguide portions respectively, said first, second and third waveguide portions being tandemly positioned along the length of said longitudinal axis.

19. The coupler of claim 18 wherein said second biasing means covers substantially all of said second and third waveguide portions.

* * * * *